(12) United States Patent
Fiedler

(10) Patent No.: US 6,417,708 B1
(45) Date of Patent: Jul. 9, 2002

(54) RESISTIVELY-LOADED CURRENT-MODE OUTPUT BUFFER WITH SLEW RATE CONTROL

(75) Inventor: Alan S. Fiedler, Bloomington, MN (US)

(73) Assignee: LSI Logic Corporation, Milpitas, CA (US)

( * ) Notice: Subject to any disclaimer, the term of this patent is extended or adjusted under 35 U.S.C. 154(b) by 27 days.

(21) Appl. No.: 09/782,842

(22) Filed: Feb. 14, 2001

Related U.S. Application Data
(60) Provisional application No. 60/237,743, filed on Oct. 2, 2000.

(51) Int. Cl.[7] .................................................. H03K 5/12
(52) U.S. Cl. ..................................................... 327/170
(58) Field of Search ................................. 327/108, 112, 327/170, 171, 52, 63, 65, 81, 82, 85, 89, 563; 326/27, 85; 330/255, 252, 257

(56) References Cited

U.S. PATENT DOCUMENTS

| | | | |
|---|---|---|---|
| 5,530,388 A | * | 6/1996 | Honnigford .................. 327/125 |
| 5,850,159 A | * | 12/1998 | Chow et al. .................. 327/170 |
| 5,877,647 A | * | 3/1999 | Vajapey et al. .............. 327/391 |
| 5,986,489 A | * | 11/1999 | Raza et al. ................... 327/112 |
| 6,081,134 A | * | 6/2000 | Labram ....................... 327/170 |
| 6,160,416 A | * | 12/2000 | Adduci et al. ................. 326/21 |

* cited by examiner

Primary Examiner—My-Trang Nuton
(74) Attorney, Agent, or Firm—Westman, Champlin & Kelly

(57) ABSTRACT

A differential output buffer includes a differential output stage, first and second push-pull circuits and first and second adjustable, controlled current sources. The differential output stage has first and second differential data outputs and first and second output stage control inputs. The first push-pull circuit has first and second complementary data inputs and has an output coupled to the first output stage control input. The second push-pull circuit has first and second complementary data inputs and has an output coupled to the second output stage control input. The outputs of the first and second push-pull circuits have rise times that are controlled by the first controlled current source and fall times that are controlled by the second controlled current source.

17 Claims, 3 Drawing Sheets

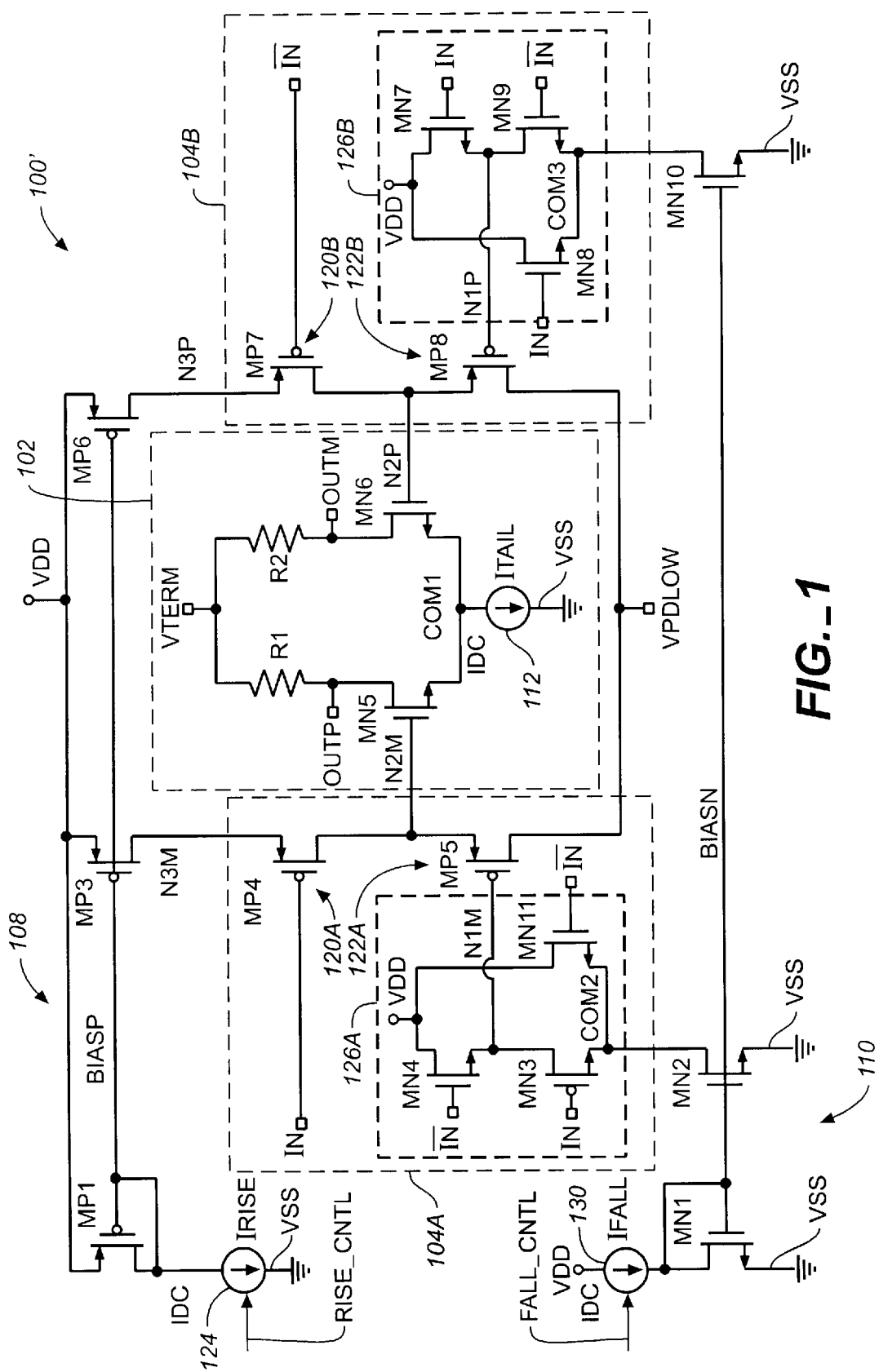
FIG._1

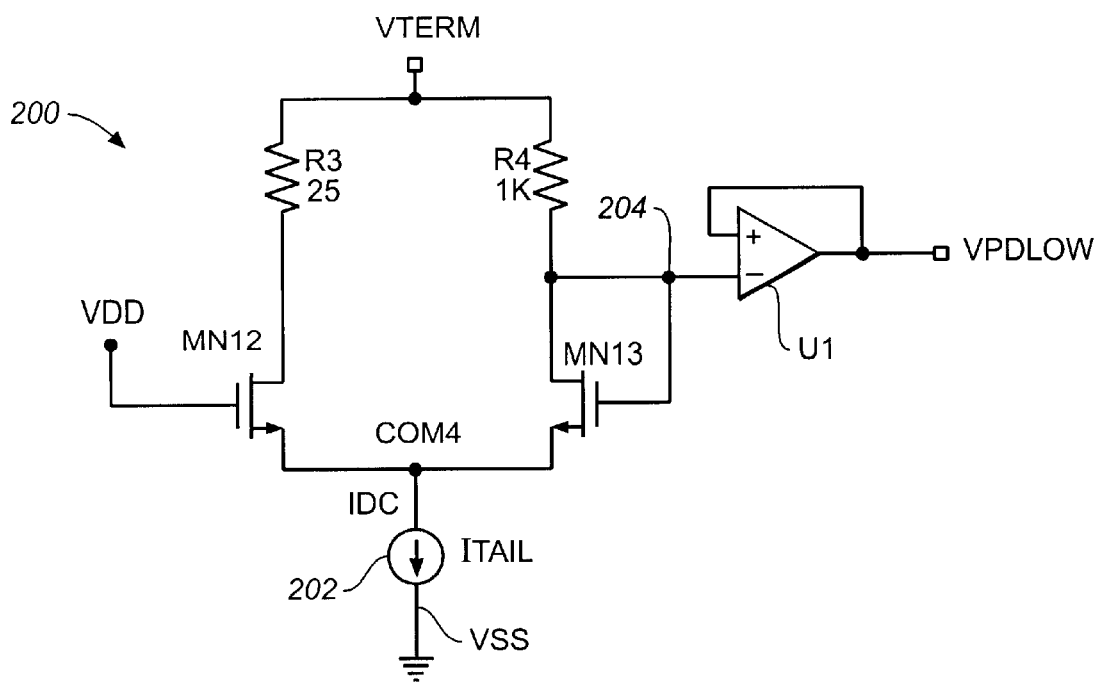
FIG._2

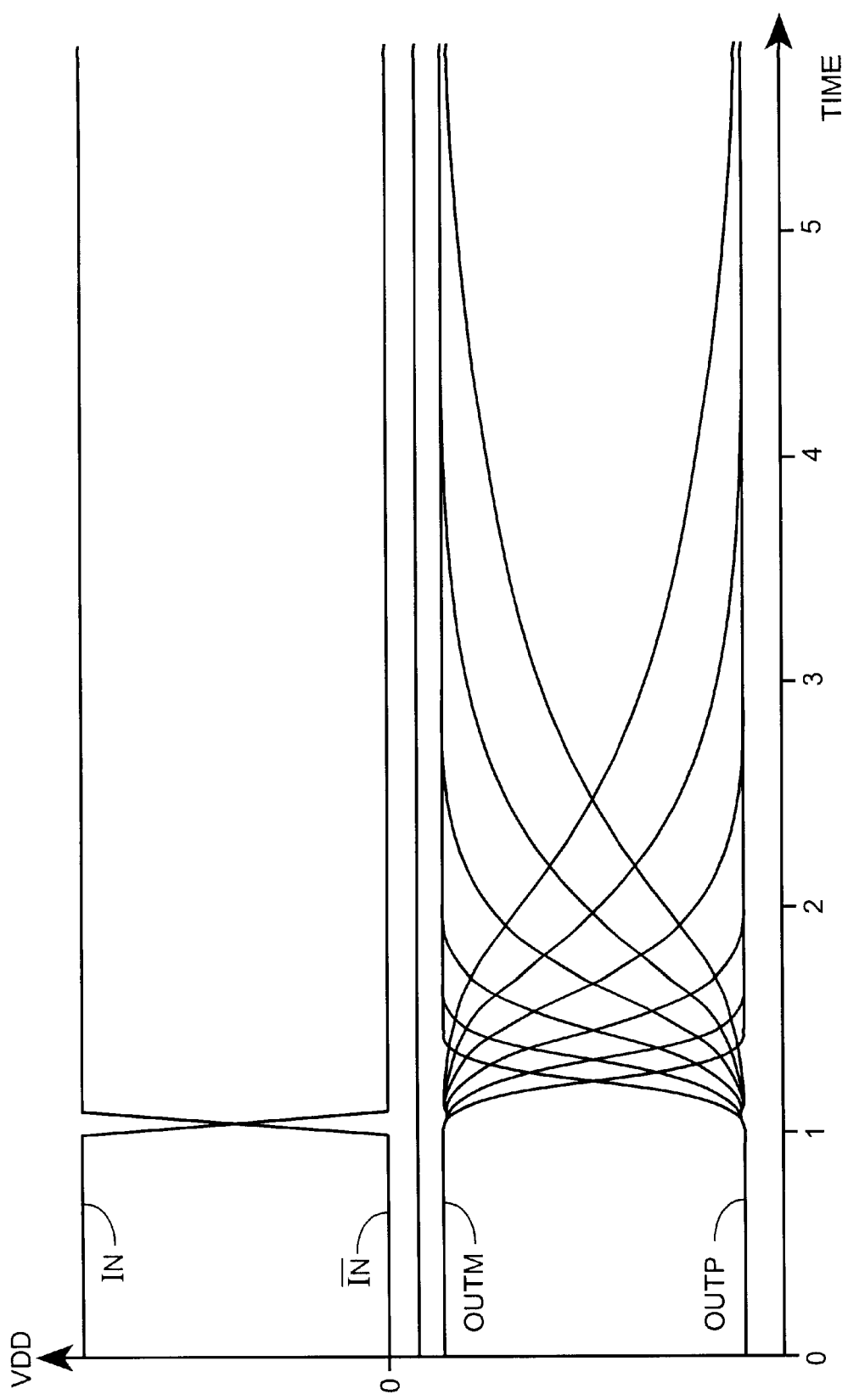
FIG._3

RESISTIVELY-LOADED CURRENT-MODE OUTPUT BUFFER WITH SLEW RATE CONTROL

CROSS-REFERENCE TO RELATED APPLICATION

This application claims priority from U.S. Provisional Application No. 60/237,743, filed Oct. 2, 2000, and entitled "RESISTIVELY-LOADED CURRENT-MODE OUTPUT BUFFER WITH SLEW RATE CONTROL."

Cross reference is also made to U.S. application Ser. No. 09/782,806, entitled "LOW-POWER DATA SERIALIZER," U.S. application Ser. No. 09/783,231, entitled "DATA SERIALIZER WITH SLEW-RATE CONTROL," and U.S. application Ser. No. 09/783,690, entitled "REDUCED-SWING DIFFERENTIAL OUTPUT BUFFER WITH IDLE FUNCTION," which were filed on even date herewith, now become U.S. Pat. No. 6,353,338.

BACKGROUND OF THE INVENTION

The present invention relates to integrated circuits. More specifically, the present invention relates to an output buffer having slew rate control.

High-speed data communication circuits frequently use output buffers for transmitting data over transmission media. Electrical signals generated at the outputs of these output buffers can have high slew rates, which can be problematic. Electrical signals with high slew rates tend to radiate excessive electromagnetic energy and contribute to excessive signal reflections, as compared to signals with lower slew rates. Therefore, the slew rate of such an electrical signal should be as slow as possible while still allowing time for the signal to settle to its final value without causing any timing errors.

Existing approaches for adjusting slew rate often use feedback techniques. A buffer's output is monitored and, through feedback, the signal at the input to the buffer is controlled so as to achieve the desired output slew rate. However, to ensure stable operation, the bandwidth and/or the gain of the feedback loop must be limited. The result is imperfect slew rate control. Another problem is that the devices that are connected to the output signal whose slew rate is being monitored so as to control its slew rate are susceptible to damage from electrostatic discharge.

An output buffer having improved slew rate control is desired.

SUMMARY OF THE INVENTION

One aspect of the present invention is directed to a differential output buffer which includes a differential output stage, first and second push-pull circuits and first and second adjustable, controlled current sources. The differential output stage has first and second differential data outputs and first and second output stage control inputs. The first push-pull circuit has first and second complementary data inputs and has an output coupled to the first output stage control input. The second push-pull circuit has first and second complementary data inputs and has an output coupled to the second output stage control input. The outputs of the first and second push-pull circuits have rise times that are controlled by the first controlled current source and fall times that are controlled by the second controlled current source.

Another aspect of the present invention is directed to a differential output buffer which includes a logic high voltage supply terminal for supplying a logic high voltage, a logic low voltage supply terminal for supplying a logic low voltage and first and second complementary data inputs. The output buffer further includes a differential output stage, first and second adjustable controlled current sources and first and second push-pull circuits. The differential output stage has first and second differential data outputs and first and second output stage control inputs. The first push-pull circuit charges a voltage on the first output stage control input toward the logic high voltage with a rise time that is controlled by the first controlled current source and discharges the voltage on the first output stage control input toward the logic low voltage with a fall time that is controlled by the second controlled current source, based on relative logic states of the first and second data inputs. The second push-pull circuit charges a voltage on the second output stage control input toward the logic high voltage with a rise time that is controlled by the first controlled current source and discharges the voltage on the second output stage control input toward the logic low voltage with a fall time that is controlled by the second controlled current source, based on the relative logic states of the first and second data inputs.

Yet another aspect of the present invention is directed to a method of controlling the slew rate at the output of a differential output buffer. The method includes providing a differential transistor pair between first and second differential data outputs and a tail current source, wherein the differential transistor pair has first and second output control inputs, and receives first and second complementary data inputs. The first and second output control inputs are driven between a logic high voltage level and a logic low voltage level with a rise time controlled by a first adjustable controlled current source and a fall time controlled by a second adjustable controlled current source, based on relative logic states of the first and second data inputs.

BRIEF DESCRIPTION OF THE DRAWINGS

FIG. 1 is a schematic diagram of a differential output buffer according to one embodiment of the present invention.

FIG. 2 is a schematic diagram of a logic low voltage generator used for the output buffer shown in FIG. 1, according to one embodiment of the present invention.

FIG. 3 is a timing diagram which shows a simulation of a step input signal to the output buffer and the resulting output signals for six different slew-rate settings.

DETAILED DESCRIPTION OF ILLUSTRATIVE EMBODIMENTS

FIG. 1 is a schematic diagram of a differential current-mode logic type of output buffer according to one embodiment of the present invention. Output buffer 100 includes output stage 102, push-pull circuits 104A and 104B and adjustable, controlled current sources 108 and 110. Output stage 102 includes tail current source 112, a differential n-channel transistor pair MN5 and MN6, differential data outputs OUTP and OUTM and load resistors R1 and R2. Tail current source 112 generates a tail current ITAIL and is coupled between the sources of transistors MN5 and MN6, at common node COM1, and voltage supply terminal VSS (e.g., ground). The drain of transistor MN5 is coupled to data output OUTP, and the drain of transistor MN6 is coupled to data output OUTM. Differential data outputs OUTP and OUTM are coupled to termination voltage supply terminal VTERM through load resistors R1 and R2, respectively. Load resistors R1 and R2 may be on-chip, off-chip or both on-chip and off-chip. Resistors R1 and R2 represent the net effective load resistance connected to OUTP and OUTM, respectively.

Differential transistor pair MN5 and MN6 connects tail current source 112 to OUTP or OUTM, depending on the relative voltages on the gates of each transistor in the pair. Thus, one of the differential outputs OUTP and OUTM will be pulled low by tail current source 112, and the other will be pulled high through the respective load resistor R1 or R2. The gates of transistors of MN5 and MN6 are coupled to respective output stage control inputs N2M and N2P. Push-pull circuits 104A and 104B drive one of the output stage control inputs N2M and N2P high, and the other low, based on the relative logic states on data inputs IN and $\overline{IN}$.

Push-pull circuit 104A includes a pull-up circuit 120A and a pull-down circuit 122A. Similarly, push-pull circuit 104B includes a pull-up circuit 120B and a pull-down circuit 122B. Pull-up circuit 120A includes P-channel pull-up transistor MP4 which is coupled in series between controlled current source 108 and output control input N2M. Pull-up transistor MP4 has a gate (i.e., a control terminal) which is coupled to data input IN. Pull-up transistor MP4 drives output control input N2M between two logic states, a logic high state and a high impedance state, depending on the logic state of data input IN.

Controlled current source 108 includes current source 124 and P-channel transistors MP1, MP3 and MP6 which are coupled together to form a current mirror that mirrors the current generated by current source 124 at the drain of transistor MP1 into the drains of transistors MP3 and MP6. Current source 124 is coupled between the gate and drain of transistor MP1 and voltage supply terminal VSS and has a current level control terminal coupled to current control input RISE_CNTL. Based on the current control input RISE_CNTL, current source 124 generates a controlled current, IRISE, which is mirrored into the drains of transistors MP3 and MP6. The sources of transistors MP1, MP3 and MP6 are coupled to logic high voltage supply terminal VDD. The gates of transistors MP3 and MP6 are coupled to the gate of transistor MP1. The drains of transistors MP3 and MP6 are coupled to the sources of pull-up transistors MP4 and MP7, respectively.

Controlled current source 108 and pull-up transistor MP4 together act as a switched current source for providing a controlled current, IRISE, to ramp output stage control input N2M toward the voltage on voltage supply terminal VDD when transistor MP4 is in an on state. Thus, the level of current provided by controlled current source 108 controls the rise time of output stage control input N2M and, by extension, the fall time of data output OUTP.

Similar to pull-up circuit 120A, pull-up circuit 120B includes P-channel pull-up transistor MP7 which is coupled in series between the drain of transistor MP6 of controlled current source 108 and output stage control input N2P. Pull-up transistor MP7 has a gate which is coupled to inverted data input $\overline{IN}$. Pull-up transistor MP7 drives output stage control input N2P between two logic states, a logic high state and a high impedance state, depending on the logic state of inverted data input $\overline{IN}$.

Pull-down circuit 122A includes P-channel pull-down transistor MP5 and buffer 126A. Pull-down transistor MP5 is coupled in series between output stage control input N2M and logic low voltage supply terminal VPDLOW. The gate of transistor of MP5 is coupled to output N1M of buffer 126A. Buffer 126A has inputs coupled to data inputs IN and $\overline{IN}$ and is biased between voltage supply terminal VDD and controlled current source 110.

Transistor MN3 is coupled in series between buffer output N1M and common node COM2 and has a gate coupled to data input IN. Transistor MN4 is coupled in series between voltage supply terminal VDD and buffer output N1M, and as a gate coupled to inverted data input $\overline{IN}$. Transistor MN11 is coupled in series between voltage supply terminal VDD and common node COM2 and has a gate coupled to inverted data input $\overline{IN}$. In an alternative embodiment, transistor MN11 is eliminated. In another alternative embodiment, N-channel transistor MN4 is replaced with a P-channel transistor having its gate coupled to data input IN. In this second alternative embodiment, the logic high output voltage on buffer output N1M is substantially VDD rather than an N-channel threshold voltage below VDD.

Controlled current source 110 supplies a tail current IFALL to buffer 126A and includes current source 130 and N-channel transistors MN1, MN2 and MN10, which are coupled together to form a current mirror. Current source 130 is coupled in series between voltage supply terminal VDD and the gate and drain of transistor MN1, and has a current level control terminal coupled to current control input FALL_CNTL. The sources of transistors MN1, MN2 and MN10 are coupled to voltage supply terminal VSS. The gates of transistors MN2 and MN10 are coupled to the gate of transistor MN1. The drains of transistors MN2 and MN10 are coupled to common nodes COM2 and COM3 of buffers 126A and 126B, respectively. Current source 130 supplies the tail current IFALL to the drain of transistor MN1. The tail current IFALL has a level that is a function of current control input FALL_CNTL. The tail current IFALL is mirrored into the drains of transistors MN2 and MN10 for providing controlled tail currents to buffers 126A and 126B.

Within buffer 126A, the controlled tail current IFALL is steered through one of the transistors MN3 and MN11 or the other, depending on the relative voltages on data inputs IN and $\overline{IN}$. When input IN goes low and input $\overline{IN}$ goes high, transistor MN3 turns off and transistors MN4 and MN11 turn on on. Transistor MN4 quickly pulls buffer output N1M high toward voltage supply terminal VDD. The logic high output voltage on buffer output N1M is an N-channel threshold voltage below VDD. Transistor MN11 holds common node COM2 high, also at an N-channel threshold voltage below VDD. When input IN goes high and input $\overline{IN}$ goes low, transistors MN4 and MN11 turn off, and transistor MN3 turns on. Transistor MN3 shorts two nodes, COM2 and N1M, whose voltages are initially the same. Controlled current source 110 then begins to pull COM2 and buffer output N1M low toward the voltage on voltage supply terminal VSS in a controlled manner as a function of the discharging tail current IFALL. Thus, the fall time of buffer output N1M can be controlled by setting the current level of IFALL through current control input FALL_CNTL. Pull-down transistor MP5 is a P-channel source-follower with a gain of approximately one. When the gate of transistor MP5 is pulled low by buffer output N1M, the source of transistor MP5 follows. Thus, by controlling the fall time of buffer output N1M, the fall time of output stage control input N2M is controlled.

Similarly, pull-down circuit 122B includes P-channel pull-down transistor MP8 and buffer 126B. Pull-down transistor MP8 is coupled in series between output stage control input N2P and logic low voltage supply terminal VPDLOW. The gate of transistor MP8 is coupled to output N1P of buffer 126B. Buffer 126B has inputs coupled to data inputs IN and $\overline{IN}$ and is biased between voltage supply terminal VDD and controlled current source 110.

Transistor MN9 is coupled in series between buffer output N1P and common node COM3 and has a gate coupled to inverted data input $\overline{\text{IN}}$. Transistor MN7 is coupled in series between voltage supply terminal VDD and buffer output N1P, and has a gate coupled to data input IN. Transistor MN8 is coupled in series between voltage supply terminal VDD and common node COM3 and has a gate coupled to data input IN. In an alternative embodiment, transistor MN8 is eliminated. In another alternative embodiment, N-channel transistor MN7 is replaced with a P-channel transistor having its gate coupled to inverted data input $\overline{\text{IN}}$. In this embodiment, the logic high output voltage on buffer output N1P is substantially VDD rather than an N-channel threshold voltage below VDD.

Controlled current source 110 supplies the tail current IFALL to buffer 126B through the drain of transistor MN10 which is coupled to common node COM3. When input $\overline{\text{IN}}$ goes low and input IN goes high, transistor MN9 turns off and transistors MN7 and MN8 turn on. Transistor MN7 quickly pulls buffer output N1P high toward voltage supply terminal VDD. The logic high output voltage on buffer output N1P is an N-channel threshold voltage below VDD. Transistor MN8 holds common node COM3 high, also at an N-channel threshold voltage below VDD. When input $\overline{\text{IN}}$ goes high and input IN goes low, transistors MN7 and MN8 turn off, and transistor MN9 turns on. Transistor MN9 shorts two nodes, COM3 and N1P, whose voltages are initially the same. Controlled current source 110 then begins to pull COM3 and buffer output N1P low toward the voltage on voltage supply terminal VSS in a controlled manner as a function of the discharging tail current IFALL. Thus, the fall time of buffer output N1P can be controlled by setting the current level of IFALL through current control input FALL_CNTL. Pull-down transistor MP8 is a P-channel source-follower with a gain of approximately one. When the gate of transistor MP8 is pulled low at buffer output N1P, the source of transistor MP8 follows. Thus, by controlling the fall time of buffer output N1P, the fall time of output stage control input N2P is controlled.

Therefore, push-pull circuits 104A and 104B control the rise and fall times of output stage control inputs N2M and N2P as a function of IRISE and IFALL. By controlling the rise and fall times of output stage control inputs N2M and N2P, the rise and fall times of data outputs OUTP and OUTM are then controlled.

Only P-channel transistors are used to drive output stage control inputs N2M and N2P, and the voltage supplied on VPDLOW is raised above the voltage on VSS in order to limit the voltage swing on N2M and N2P. The voltage on VPDLOW sets the logic low level for the signals on N2M and N2P. The logic high level for the signals on N2M and N2P is VDD. The voltage on VPDLOW is chosen so that the logic low voltages on N2M and N2P are just slightly less than an N-channel gate-to-source threshold voltage, $V_{TN}$, above the voltage on common node COM1. This ensures that the current in the "off" transistor, either MN5 or MN6, is zero or nearly zero. It also ensures that the controlled slew rate on differential output stage inputs N2M and N2P induces a similar controlled slew rate on differential output stage outputs OUTP and OUTM. Thus, the voltage on VPDLOW is raised high enough for good slew rate control but low enough to ensure complete or nearly complete switching of transistors MN5 and MN6. The appropriate voltage on VPDLOW can be delivered to differential output buffer 100 from off-chip or on-chip. In one embodiment, an on-chip logic low voltage supply generator is used to generate the appropriate voltage on VPDLOW.

FIG. 2 is a schematic diagram which illustrates a logic low voltage generator 200 according to one embodiment of the present invention. Generator 200 includes tail current source 202, differential N-channel transistor pair MN12 and MN13, load resistors R3 and R4 and buffer U1. Tail current source 202, differential transistor pair MN12 and MN13 and load resistors R3 and R4 together form a "replica" of differential output stage 102 shown in FIG. 1. However, the gate of transistor MN12 is coupled to voltage supply terminal VDD, and the gate and drain of transistor MN13 are coupled to voltage output node 204. The sources of transistors MN12 and MN13 are coupled to common node COM4, which replicates the voltage on common node COM1 shown in FIG. 1.

Also in differential output buffer 102 in FIG. 1, load resistors R1 and R2 typically have the same resistance values, such as 25 ohms. In generator 200, load resistor R4 is increased from 25 ohms to 1K ohms, as compared to load resistor R3. This increase in resistance switches almost all of the current from tail current source 202 to the left side of the differential pair formed by transistors MN12 and MN13. Just a trickle of current flows through transistor MN13. If the tail current supplied by tail current source 202 is the same as the tail current supplied by tail current source 112 and the resistance of load resistor R3 is the same as the resistances of load resistors R1 and R2, then the voltage on common node COM4 will replicate the voltage on common node COM1. With transistor MN13 barely on, its gate and drain are biased at an N-channel threshold voltage above the voltage on common node COM4 (which replicates the voltage on common node COM1). Thus, the voltage on voltage output 204 is an N-channel threshold voltage above the voltage on common node COM1. Buffer U1 is coupled in series between voltage output 204 and logic low voltage supply terminal VPDLOW. In one embodiment, buffer U1 has unity gain. Thus, generator 200 sets the voltage on VPDLO at an N-channel threshold voltage above the voltage on common node COM1.

In alternative embodiments, the magnitude of current supplied by tail current source 202, the width of transistors MN12 and MN13 and the conductance of load resistors R2 and R4 are all scaled down in equal proportions to reduce the power consumed by generator 200 without affecting the circuit operation. Also, while the ratio of the resistance of resistor R4 to the resistance of resistor R3 should be large (1 K Ohm/25 Ohm in this example), any large ratio would do.

In embodiments in which a lower VPDLOW is desired, this lower voltage can be achieved in a number of ways. One way is to reduce the size of transistor MN12 in generator 200. Another way is to place some resistance in the feedback path between the output of buffer U1 and the inverting input of buffer U1 and to source a controlled current into the inverting input of U1. In another alternative embodiment, generator 200 includes only transistor MN13, resistor R4 and buffer U1. Transistor MN12, resistor R3 and tail current source 202 are eliminated. In this embodiment, the source of transistor MN13 is coupled to common node COM1 in FIG. 1. Again, VPDLOW would be biased at an N-channel gate-to-source threshold voltage above COM1. Other methods of setting the voltage on VPDLO can also be used.

FIG. 3 is a graph illustrating a simulation of data inputs IN and $\overline{\text{IN}}$ and differential outputs OUTP and OUTM over time for the differential output buffer shown in FIG. 1. The graph shows an overlay of outputs OUTP and OUTM for six different pairs of settings for IRISE and IFALL. In this example, IRISE and IFALL are set to the same value and then varied by a total factor of 32. Assigning a current value of "1" for IRISE and IFALL for the fastest slew rate, the remaining pairs of output signals are generated with IRISE=

2, 4, 8, 16 and 32 and IFALL=2, 4, 8, 16 and 32. As shown in FIG. 3, the slew rate of differential output buffer 100 can be easily adjusted by appropriate settings of RISE_CNTL and FALL_CNTL. These settings can be programmable on-chip through a set of registers, for example, or can be set on-chip or off-chip by other methods.

The differential output buffer of the present invention has a slew rate that is controlled solely by controlling the slew rate of specialized circuits at the inputs to the output buffer. By controlling the rise and fall times at the inputs to the output buffer, the rise and fall times at the output buffers can be controlled.

Although the present invention has been described with reference to preferred embodiments, workers skilled in the art will recognize that changes may be made in form and detail without departing from the spirit and scope of the invention. For example, the output buffer has been described with the use of complementary metal-oxide semiconductor field-effect transistors (CMOS). However, transistors of other technologies can also be used. The terms "high" and "low" are arbitrary terms that are interchangeable in the specification and claims, and any element can be active high or low, with appropriate inversions. In addition, the term "coupled" used in the specification and the claims can include various types of connections or couplings and can include a direct connection or a connection through one or more intermediate components.

What is claimed is:

1. A differential output buffer comprising:
   logic high and logic low voltage supply terminals;
   first and second complementary data inputs;
   a differential output stage comprising first and second differential data outputs and first and second output stage control inputs;
   first and second adjustable controlled current sources;
   a first push-pull circuit biased between the logic high and logic low voltage supply terminals and having first and second inputs coupled to the first and second data inputs and an output coupled to the first output stage control input, wherein the output of the first push-pull circuit has a rise time controlled by the the first controlled current source and a fall time controlled by the second controlled current source; and
   a second push-pull circuit biased between the logic high and logic low voltage supply terminals and having first and second inputs coupled to the first and second data inputs and an output coupled to the second output stage control input, wherein the output of the second push-pull circuit has a rise time controlled by the first controlled current source and a fall time controlled by the second controlled current source.

2. The differential output buffer of claim 1 wherein each of the first and second push-pull circuits comprises a pull-up circuit comprising:
   a p-channel pull-up transistor coupled in series between the first controlled current source and the respective first or second output stage control input and having a pull-up control terminal;
   wherein the first controlled current source is coupled between the logic high voltage supply terminal and the p-channel transistor and has a current control input which controls a level of current supplied to the p-channel pull-up transistor by the first controlled current source; and
   wherein the pull-up control terminal in the first push-pull circuit is coupled to one of the first and second comple-
   mentary data inputs and the pull-up control terminal in the second push-pull circuit is coupled to the other of the first and second complementary data inputs.

3. The differential output buffer of claim 1 wherein each of the first and second push-pull circuits comprises a pull-down circuit comprising:
   a pull-down buffer which has a buffer input coupled to at least one of the first and second complementary data inputs, has a buffer output, and is biased between the logic high voltage supply terminal and the second controlled current source so as to have a fall time at the buffer output that is controlled by the second controlled current source; and
   a p-channel pull-down transistor which is coupled as a voltage follower in series between the respective first or second output stage control input and the logic low voltage supply terminal and has a pull-down control terminal driven by the buffer output.

4. The differential output buffer of claim 3 wherein the pull-down buffer is an inverting pull-down buffer and comprises:
   a first, n-channel transistor coupled in series between the logic high voltage supply terminal and the buffer output and having a first control terminal, wherein the first control terminal of the first, n-channel transistor in the first push-pull circuit is coupled to one of the first and second data inputs and the first control terminal of the first, n-channel transistor in the second push-pull circuit is coupled to the other of the first and second data inputs;
   a second, n-channel transistor coupled in series between the buffer output and the second controlled current source and having a second control terminal coupled to the other of the first and second data inputs; and
   wherein the second controlled current source is coupled in series between the second, n-channel transistor and the logic low voltage supply terminal and has a current control input which controls a level of current supplied to the inverting buffer by the second controlled current source.

5. The differential output buffer of claim 4 wherein the inverting pull-down buffer further comprises:
   a third, n-channel transistor coupled in series between the logic high voltage supply terminal and second controlled current source and having a third control terminal coupled to the first or second data input that is coupled to the first control terminal of the first, n-channel transistor.

6. The differential output buffer of claim 3 wherein the pull-down buffer is an inverting pull-down buffer and comprises:
   a first p-channel transistor coupled in series between the logic high voltage supply terminal and the buffer output and having a first control terminal, wherein the first control terminal of the first, p-channel transistor in the first push-pull circuit is coupled to one of the first and second data inputs and the first control terminal of the first, p-channel transistor in the second push-pull circuit is coupled to the other of the first and second data inputs;
   a second, n-channel transistor coupled in series between the buffer output and the second controlled current source and having a second control terminal coupled to the other of the first and second data inputs; and
   wherein the second controlled current source is coupled in series between the second n-channel transistor and the logic low voltage supply terminal and has a current control input which controls a level of current supplied to the inverting buffer by the second controlled current source.

7. The differential output buffer of claim 3 wherein the differential output stage comprises:

a ground terminal;

a first tail current source coupled to the ground terminal; and a first differential transistor pair coupled to the first and second differential data outputs and comprising a common node coupled to the first tail current source and a pair of transistor control terminals that forms the first and second differential output stage control inputs.

8. The differential output buffer of claim 7 wherein:

the first differential transistor pair comprises n-channel transistors having a gate-to-source threshold voltage; and the logic low voltage supply terminal is biased at a voltage that is greater than a voltage on the ground terminal and less than or equal to a voltage on the common node plus the gate-to-source threshold voltage.

9. The differential output buffer of claim 8 and further comprising a logic low voltage supply generator comprising:

a termination voltage supply terminal;

first and second pull-up resistors coupled to the termination voltage supply terminal;

a second tail current source coupled to the ground terminal;

a second, replica differential transistor pair comprising a first transistor coupled in series between the first pull-up resistor and a replica common node and having a first transistor control terminal coupled to the logic high voltage supply terminal, and a second transistor coupled as a diode in series between the second pull-up resistor and the replica common node;

a voltage output coupled to a node between the second pull-up resistor and the second transistor; and a further buffer which is coupled between the voltage output and the logic low voltage supply terminal.

10. A differential output buffer comprising:

logic high voltage supply terminal for supplying a logic high voltage;

a logic low voltage supply terminal for supplying a logic low voltage;

first and second complementary data inputs;

a differential output stage comprising first and second differential data outputs and first and second output stage control inputs;

first and second adjustable controlled current sources;

a first push-pull means for charging a voltage on the first output stage control input toward the logic high voltage with a rise time that is controlled by the first controlled current source and for discharging the voltage on the first output stage control input toward the logic low voltage with a fall time that is controlled by the second controlled current source, based on relative logic states of the first and second data inputs; and a second push-pull means for charging a voltage on the second output stage control input toward the logic high voltage with a rise time that is controlled by the first controlled current source and for discharging the voltage on the second output stage control input toward the logic low voltage with a fall time that is controlled by the second controlled current source, based on the relative logic states of the first and second data inputs.

11. The differential output buffer of claim 10 wherein the first and second push-pull means each comprise a pull-up circuit comprising:

a p-channel pull-up transistor coupled in series between the first controlled current source and the respective first or second output stage control input and having a pull-up control terminal;

wherein the first controlled current source is coupled between the logic high voltage supply terminal and the p-channel transistor and has a current control input which controls a level of current supplied to the p-channel pull-up transistor by the first controlled current source; and wherein the pull-up control terminal in the first push-pull means is coupled to one of the first and second data inputs and the pull-up control terminal in the second push-pull means is coupled to the other of the first and second data inputs.

12. The differential output buffer of claim 10 wherein the first and second push-pull means each comprise a pull-down circuit comprising:

buffer means which is biased between the logic high voltage supply terminal and the second controlled current source for generating a pull-down control voltage as a function of at least one of the first and second data inputs, wherein the pull-down control voltage has a fall time that is controlled by the second controlled current source; and a p-channel pull-down transistor which is coupled as a voltage follower in series between the respective first or second output stage control input and the logic low voltage supply terminal and has a pull-down control terminal driven by the pull-down control voltage.

13. The differential output buffer of claim 12 wherein the differential output stage comprises:

a ground terminal;

a first tail current source coupled to the ground terminal; and a first n-channel differential transistor pair coupled to the first and second differential data outputs and comprising a common node coupled to the first tail current source and a pair of transistor control terminals that forms the first and second output stage control inputs.

14. The differential output buffer of claim 13 wherein the transistors in the first n-channel differential transistor pair each have a gate-to-source threshold voltage and wherein the differential output buffer further comprises:

logic low voltage generator means for generating a logic low voltage on the logic low voltage supply terminal which is substantially equal to a voltage on the common node plus the gate-to-source threshold voltage.

15. The differential output buffer of claim 14 wherein the logic low voltage generator means comprises:

a termination voltage supply terminal;

first and second pull-up resistors coupled to the termination voltage supply terminal;

a second tail current source coupled to the ground terminal;

a second, replica differential transistor pair comprising a first transistor coupled in series between the first pull-up resistor and a replica common node and having a first transistor control terminal coupled to the logic high voltage supply terminal, and a second transistor coupled as a diode in series between the second pull-up resistor and the replica common node;

a voltage output coupled to a node between the second pull-up resistor and the second transistor; and further buffer means, which is coupled between the voltage output and the logic low voltage supply terminal.

16. A method of controlling the slew rate at the output of a differential output buffer, the method comprising:

(a) providing a differential transistor pair between first and second differential data outputs and a tail current source, wherein the differential transistor pair comprises first and second output control inputs;

(b) receiving first and second complementary data inputs; and (c) driving the first and second output control inputs between a logic high voltage level and a logic low voltage level with a rise time controlled by a first adjustable controlled current source and a fall time controlled by a second adjustable controlled current source, based on relative logic states of the first and second data inputs.

17. The method of claim 16 wherein step (c) comprises:

(c)(1) selectively driving the first or second output control input toward the logic high voltage level with first and second p-channel pull-up transistors respectively, which are coupled in series between the first controlled current source and the respective first and second output control inputs; and (c)(2) selectively driving the first or second output control input toward the logic low voltage level with first and second p-channel pull-down transistors, respectively, which are coupled as source-followers in series between the respective first and second output control inputs and a logic low voltage supply terminal and have control terminals driven with respective buffers.

* * * * *